(12) United States Patent
Hisaka (10) Patent No.: US 11,967,537 B2
(45) Date of Patent: Apr. 23, 2024

(54) SEMICONDUCTOR APPARATUS AND SEMICONDUCTOR APPARATUS LEAK INSPECTION METHOD

(71) Applicant: Mitsubishi Electric Corporation, Tokyo (JP)

(72) Inventor: Takayuki Hisaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 476 days.

(21) Appl. No.: 17/268,943

(22) PCT Filed: Nov. 13, 2018

(86) PCT No.: PCT/JP2018/041955
§ 371 (c)(1),
(2) Date: Feb. 16, 2021

(87) PCT Pub. No.: WO2020/100208
PCT Pub. Date: May 22, 2020

(65) Prior Publication Data
US 2021/0313242 A1    Oct. 7, 2021

(51) Int. Cl.
*H01L 23/26*    (2006.01)
*H01L 21/66*    (2006.01)
*H01L 23/00*    (2006.01)

(52) U.S. Cl.
CPC .............. *H01L 23/26* (2013.01); *H01L 22/30* (2013.01); *H01L 23/564* (2013.01)

(58) Field of Classification Search
CPC ............. H01L 22/14; H01L 22/30–34; H01L 23/04–10; H01L 23/26; H01L 23/564
See application file for complete search history.

(56) References Cited

U.S. PATENT DOCUMENTS

| 4,112,417 A * | 9/1978 | Himeno ............... G21C 17/002 73/49.1 |
| 5,837,935 A | 11/1998 | Carper et al. |
| 2012/0176148 A1* | 7/2012 | Chey ................... G01N 17/00 29/829 |
| 2015/0330889 A1 | 11/2015 | Minamitani et al. |
| 2020/0124492 A1 | 4/2020 | Sasaki |

FOREIGN PATENT DOCUMENTS

| JP | H09-237847 A | 9/1997 |
| JP | 2012-163539 A | 8/2012 |
| JP | 2015-219075 A | 12/2015 |
| JP | 2017-003376 A | 1/2017 |
| JP | 6381854 B1 | 8/2018 |

OTHER PUBLICATIONS

International Search Report issued in PCT/JP2018/041955; dated Feb. 5, 2019.

* cited by examiner

*Primary Examiner* — Andres Munoz
(74) *Attorney, Agent, or Firm* — Studebaker & Brackett PC (57) ABSTRACT

A semiconductor device, a leak detection device, an outer wall, and a separation wall are provided on a substrate. A first hollow structure in contact with the semiconductor device and a second hollow structure in contact with the leak detection device are separated by the separation wall and formed in a hermetically sealed state. At least a part of a portion of the leak detection device in contact with the second hollow structure is made of a corrodible metal or an alloy containing a corrodible metal. At least a part of the outer wall is in contact with the second hollow structure.

16 Claims, 11 Drawing Sheets

SEMICONDUCTOR APPARATUS AND SEMICONDUCTOR APPARATUS LEAK INSPECTION METHOD

TECHNICAL FIELD

The present invention relates to a semiconductor apparatus having a hollow structure and a leak inspection method thereof.

BACKGROUND ART

In some semiconductor apparatuses, a hollow structure in which hermeticity is maintained is formed around a semiconductor device. Such a semiconductor apparatus is often subjected to leak inspection to check the hermeticity of the hollow structure. In some semiconductor apparatuses having the hollow structure, a leak detection device is disposed in the hollow structure for checking the hermeticity (for example, refer to Patent Document 1). The leak detection device detects whether or not a specific gas has entered the hollow structure, thereby enabling the leak inspection.

CITATION LIST

Patent Document

Patent Document 1: Japanese Patent Application Laid-open No. 2012-163539

SUMMARY OF INVENTION

Problems to be Solved by Invention

However, in the semiconductor apparatus described above, since both the semiconductor device and the leak detection device are disposed in the hollow structure, the volume of the hollow structure increases. As a result, when a device having a problem in the hermeticity is subjected to the leak inspection, it takes a long time for the concentration of a specific gas entering the hollow structure to reach a detectable level. This increases the time required for the leak inspection. The present invention has been made to solve the above problem, and an object of the present invention is to provide a semiconductor apparatus and an inspection method thereof capable of shortening the time required for the leak inspection.

Means for Solving Problems

A semiconductor apparatus according to the present invention is provided with:
a substrate;
a semiconductor device provided on the substrate;
a leak detection device provided on the substrate;
an outer wall that is provided on the substrate and surrounds the semiconductor device and the leak detection device so as to go around as viewed from a direction perpendicular to the substrate;
a separation wall that is provided on the substrate, the separation wall separating a region surrounded by the outer wall into a region including the semiconductor device and a region including the leak detection device as viewed from a direction perpendicular to the substrate;
a lid that is provided on the outer wall and the separation wall so as to face the substrate, the lid forming, with the substrate, the outer wall, and the separation wall, a first hollow structure of a hermetically sealed state in contact with the semiconductor device and a second hollow structure of a hermetically sealed state in contact with the leak detection device; and
a terminal that is electrically connected to the leak detection device and at least a part of which is exposed to an outside, wherein
at least a part of a portion of the leak detection device that is in contact with the second hollow structure is a leak detection member made of a corrodible metal or an alloy containing a corrodible metal, and the outer wall includes a first outer wall portion that is in contact with the second hollow structure, and a second outer wall portion that is not in contact with the second hollow structure.

A leak inspection method for a semiconductor apparatus according to the present invention comprises the steps, in order, of:
measuring an electrical resistance of a leak detection device as R1 via a terminal;
placing the semiconductor apparatus in an atmosphere having a high humidity gas;
measuring an electrical resistance of the leak detection device as R2 via the terminal; and
determining that hermeticity of a first hollow structure is poor when a difference between R2 and R1 is larger than a predetermined threshold value, wherein
the semiconductor apparatus comprises:
a substrate;
a semiconductor device provided on the substrate;
the leak detection device provided on the substrate;
an outer wall that is provided on the substrate and surrounds the semiconductor device and the leak detection device so as to go around as viewed from a direction perpendicular to the substrate;
a separation wall that is provided on the substrate, the separation wall separating a region surrounded by the outer wall into a region including the semiconductor device and a region including the leak detection device as viewed from a direction perpendicular to the substrate;
a lid that is provided on the outer wall and the separation wall so as to face the substrate, the lid forming, with the substrate, the outer wall, and the separation wall, the first hollow structure of a hermetically sealed state in contact with the semiconductor device and a second hollow structure of a hermetically sealed state in contact with the leak detection device; and
the terminal that is electrically connected to the leak detection device and at least a part of which is exposed to an outside, wherein
at least a part of a portion of the leak detection device that is in contact with the second hollow structure is a leak detection member made of a corrodible metal or an alloy containing a corrodible metal, and at least a part of the outer wall is in contact with the second hollow structure.

Effect of Invention

According to the semiconductor apparatus and the leak inspection method for the semiconductor apparatus in the present invention, since the hollow structure in contact with the leak detection device is separated from the hollow structure in contact with the semiconductor device by the separation wall, the time required for the leak inspection can be shortened.

MODES FOR CARRYING OUT INVENTION

A semiconductor apparatus and a leak inspection method thereof according to embodiments will be described referring to the drawings. The same or corresponding components are denoted by the same reference numerals, and repetitive description may be omitted.

Embodiment 1

Figure 1A:
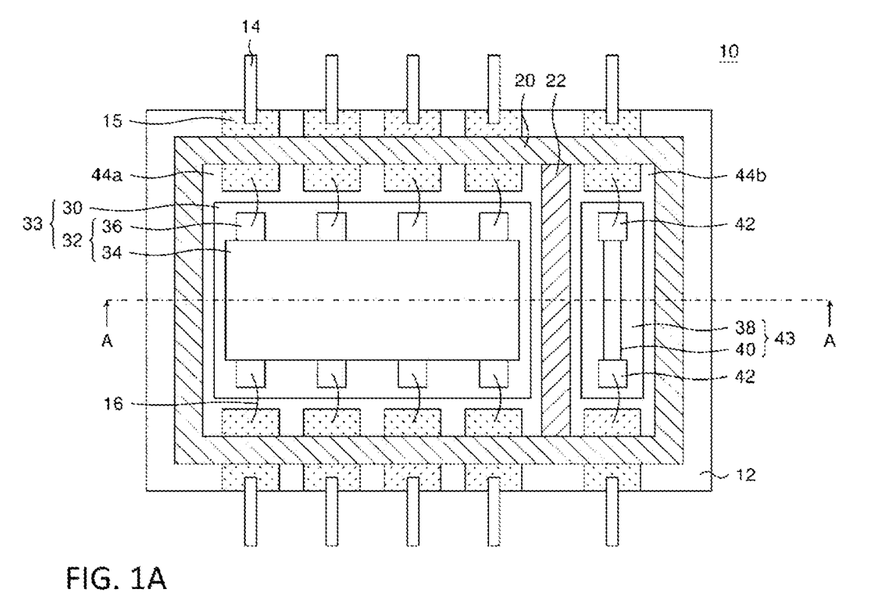
FIG. 1A and FIG. 1B are a top view and a cross sectional view showing a semiconductor apparatus according to Embodiment 1 respectively.
Figure 1B:
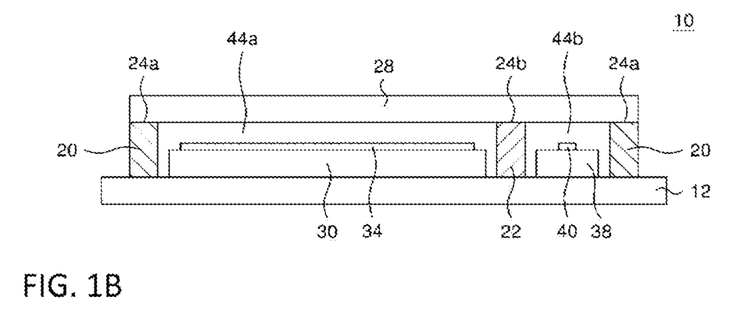

A semiconductor apparatus according to Embodiment 1 of the present invention will be described. FIG. 1A and FIG. 1B show a semiconductor apparatus 10 according to Embodiment 1. FIG. 1A is a top view of the semiconductor apparatus 10. Note that a lid 28 is shown transparently. FIG. 1B is a cross sectional view taken along the line A-A of FIG. 1A.

On a package substrate 12, a semiconductor substrate 30 and a semiconductor substrate 38 are provided. The package substrate 12 is made of ceramic. The semiconductor substrate 30 is made of a semiconductor such as Si, GaAs, or SiC. The semiconductor substrate 38 is also made of a semiconductor such as Si, GaAs, or SiC.

A semiconductor element 32 is formed on the semiconductor substrate 30. The semiconductor element 32 includes a circuit element 34 and semiconductor element electrodes 36. The circuit element 34 includes, for example, a power amplifier circuit. The semiconductor element electrodes 36 are electrodes for supplying power to the circuit element 34 or for the signal input/output.

Figure 2:
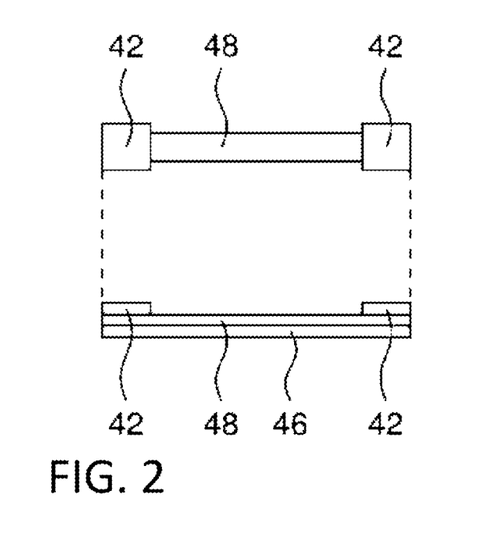
FIG. 2 is a top view and a cross sectional view showing a leak detection element according to Embodiment 1.

On the semiconductor substrate 38, a leak detection element 40 is formed. FIG. 2 is a top view and a cross sectional view of the leak detection element 40. The leak detection element 40 is formed such that a corrodible metal layer 48 is laminated on a metal layer 46, and leak detection element electrodes 42 are formed on both ends of the corrodible metal layer 48. The metal layer 46 is made of Au. The corrodible metal layer 48 is made of Mo which is a corrodible metal. Here, the corrodible metal is a metal which, when immersed in a solution, dissolves (corrosion) at electrical potential of the solution of about zero and the pH of about seven to increase electrical resistance. The leak detection element electrode 42 is made of Au. The upper surface of the corrodible metal layer 48 is exposed except for portions covered with the leak detection element electrodes 42. The leak detection element electrode 42 may be extended out from the corrodible metal layer 48 and formed on the semiconductor substrate 38 or another structure.

As described above, the semiconductor element 32 is formed on the semiconductor substrate 30, and in this embodiment, a combination of these is referred to as a semiconductor device 33. The leak detection element 40 is formed on the semiconductor substrate 38, and in this embodiment, a combination of these is referred to as a leak detection device 43. Then, the semiconductor device 33 and the leak detection device 43 are provided on the package substrate 12.

An outer wall 20 and a separation wall 22 are formed on the package substrate 12. The outer wall 20 and the separation wall 22 are made of ceramic. The package substrate 12, the outer wall 20 and the separation wall 22 may be integrally formed, or may be separately formed and then bonded. In this embodiment, they are integrally formed.

As shown in FIG. 1A, the outer wall 20 is formed to surround the semiconductor device 33 and the leak detection device 43 so as to go around. As shown in FIG. 1A, the separation wall 22 is formed to separate a region surrounded by the outer wall 20 into a region including the semiconductor device 33 and a region including the leak detection device 43.

The lid 28 is bonded on the outer wall 20 and the separation wall 22 so as to face the package substrate 12. The lid 28 is made of Cu or CuW whose surface is plated with Au. The lid 28 is bonded to the outer wall 20 at a joint portion 24a and is bonded to the separation wall 22 at a joint portion 24b.

The package substrate 12, the outer wall 20, the separation wall 22, and the lid 28 form a hollow structure 44a in contact with the semiconductor device 33 and a hollow structure 44b in contact with the leak detection devices 43. Here, the hollow structure is a cavity region surrounded by structures such as the substrate, the walls, and the lid. The hollow structure 44a and the hollow structure 44b are in hermetically sealed state independent of each other and filled with dry nitrogen. The outer wall 20 has a portion in contact with and a portion not in contact with the hollow structure 44b. The hollow structure 44a and the hollow structure 44b may be in a vacuum.

On the package substrate 12, lead electrodes 15 are formed, and leads 14 are bonded to the lead electrodes 15.

The leads 14 are electrically connected to the semiconductor element electrodes 36 and the leak detection element electrodes 42 through bonding wires 16 and the lead electrodes 15.

A method of manufacturing the semiconductor apparatus according to Embodiment 1 will be described. First, the semiconductor substrate 30 on which the semiconductor element 32 is formed and the semiconductor substrate 38 on which the leak detection element 40 is formed are prepared. A well-known semiconductor process may be used to form the semiconductor element 32 on the semiconductor substrate 30. A well-known semiconductor process may also be used to form the leak detection element 40 on the semiconductor substrate 38.

Next, the semiconductor substrate 30 and the semiconductor substrate 38 are bonded onto the package substrate 12 on which the outer wall 20 and the separation wall 22 are formed. Next, the bonding wires 16 are bonded to the semiconductor element electrodes 36 and the lead electrodes 15 and are bonded to the leak detection element electrodes 42 and the lead electrodes 15.

Next, the lid 28 is bonded onto the outer wall 20 and the separation wall 22. The bonding is performed in a dry nitrogen atmosphere. As a result, the hollow structure 44a and the hollow structure 44b are filled with dry nitrogen. Thus, the formation of the semiconductor apparatus 10 is completed.

Figure 3:
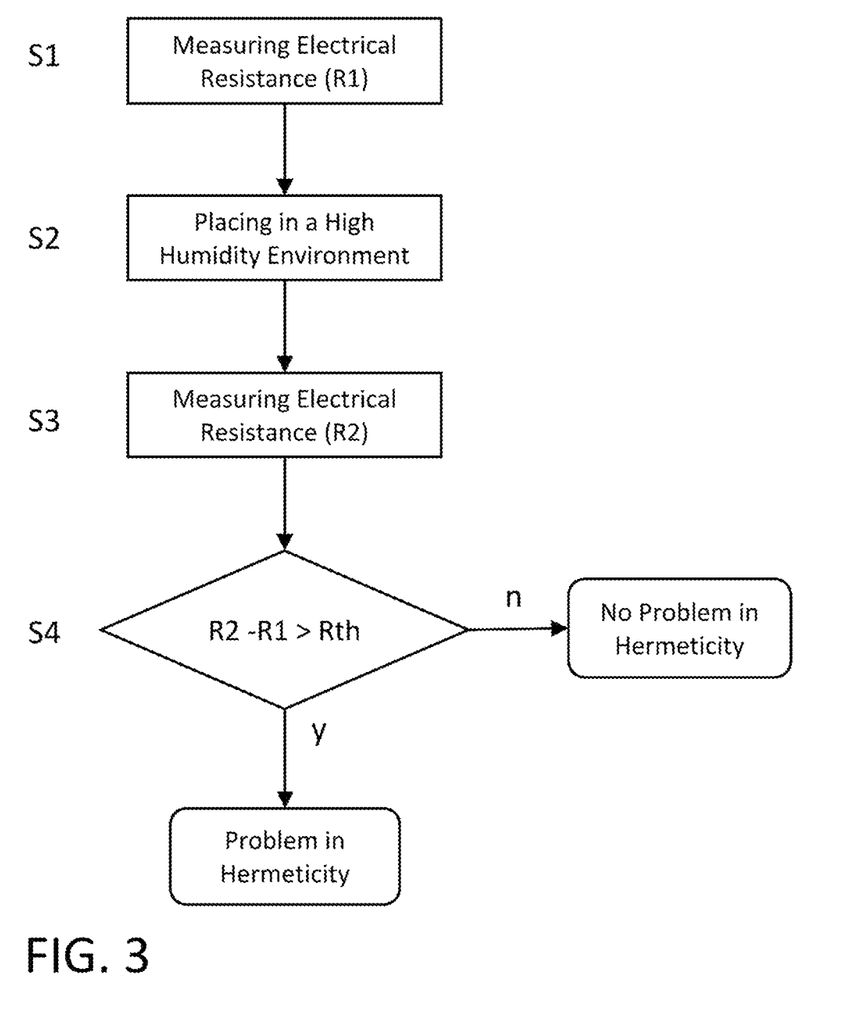
FIG. 3 is a flowchart explaining a leak inspection method for the semiconductor apparatus according to Embodiment 1.

A leak inspection method for the semiconductor apparatus according to Embodiment 1 will be described. FIG. 3 is a flowchart for explaining the leak inspection method.

First, electrical resistance of the leak detection element 40 is measured via the leads 14 (S1). The measured value is to be defined as R1.

Next, the semiconductor apparatus 10 is placed in a high humidity environment (S2). The humidity at this time is set to, for example, 85% RH. The temperature is, for example, 130 degrees C. The time for placing the apparatus in the high humidity environment is, for example, 240 hours. Note that the above conditions are not essential, and for example, an environment in which the humidity and the temperature are respectively 85% RH and 85 degrees C. may be used.

At this time, if there is a problem in the bonding quality at a part of the joint portion 24a that is in contact with the hollow structure 44b, or if a crack exists at a part of the outer wall 20 that is in contact with the hollow structure 44b, a high humidity gas enters the hollow structure 44b, and the humidity increases.

In the semiconductor apparatus according to Embodiment 1, since the hollow structure 44a and the hollow structure 44b are separated from each other by the separation wall 22, the volume of the hollow structure 44b in contact with the leak detection device 43 is smaller than that in the conventional semiconductor apparatus. Therefore, the rate of increase in the humidity of the hollow structure 44b is faster than in the conventional apparatus.

When the humidity of the hollow structure 44b increases, the high humidity gas comes into contact with the leak detection element 40. The corrodible metal layer 48 is exposed at least at a part of a portion of the leak detection element 40 that is in contact with the hollow structure 44b, and the metal layer 46 is provided below the corrodible metal layer 48. Since Mo, a component of the corrodible metal layer 48, is a corrodible metal and the ionization tendency thereof is higher than that of Au, its electrical resistance becomes higher due to an electrochemical reaction when the leak detection element 40 comes into contact with the high humidity gas. The rate of increase in the electrical resistance increases as the hollow structure 44b becomes higher in humidity.

Next, the semiconductor apparatus 10 is taken out from the high humidity environment, and the electrical resistance of the leak detection element 40 is measured again (S3). The measured value is to be defined as R2.

Next, R2 is compared with R1 to determine whether the hollow structure 44b has a problem in the hermeticity. Specifically, using a preset threshold value Rth, it is checked whether R2−R1>Rth (S4). If R2−R1>Rth, it is determined that the hollow structure 44b has a problem in the hermeticity.

As the cause of the poor hermeticity of the hollow structure 44b, as described above, it is considered that bonding quality at a part of the joint portion 24a in contact with the hollow structure 44b has a problem, or that a crack exists at a part of the outer wall 20 in contact with the hollow structure 44b. If such a defect occurs, it is highly likely that the joint portion 24a in contact with the hollow structure 44a or a part of the outer wall 20 in contact therewith may also have a problem. Therefore, using the condition R2−R1>Rth, it is possible to determine whether the hermeticity of the hollow structure 44a is good or poor.

As described above, according to Embodiment 1, the hollow structure 44b is separated from the hollow structure 44a by the separation wall 22, so that the volume of the hollow structure 44b is small. Therefore, if the hermeticity of the hollow structure 44b is poor, the rate of increase in the humidity of the hollow structure 44b at the time of leak inspection is fast, so that the rate of increase in the electrical resistance of the leak detection element 40 is also fast. As a result, the time required for the leak inspection can be shortened.

Figure 4A:
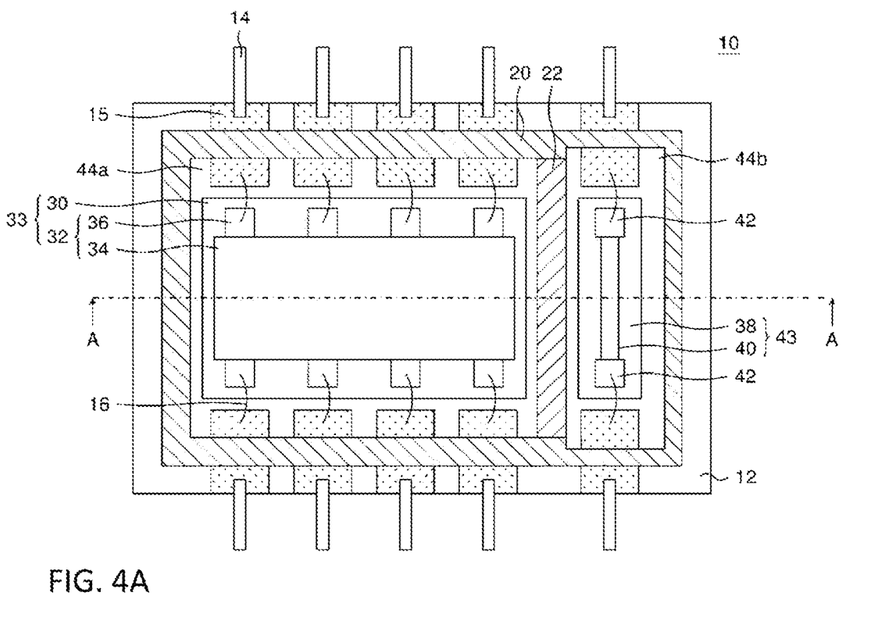
FIG. 4A and FIG. 4B are a top view and a cross sectional view showing a variation of the semiconductor apparatus according to Embodiment 1 respectively.
Figure 4B:
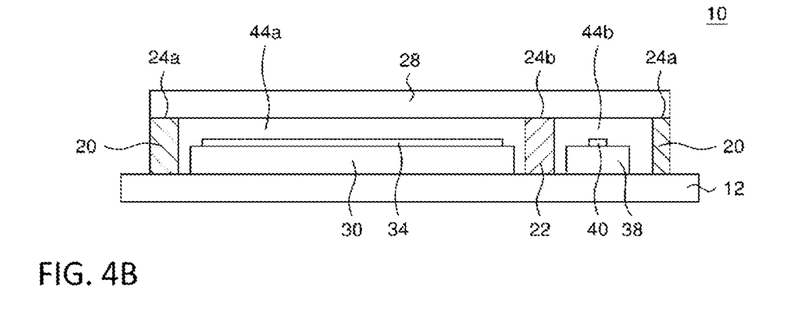

Note that, as shown in FIG. 4A and FIG. 4B, the thickness of a part of the outer wall 20 that is in contact with the hollow structure 44b may be reduced. In this case, if a part of the joint portion 24a in contact with the 44b of the hollow structure or a part of the outer wall 20 in contact therewith has a problem, a high humidity gas is likely to enter the hollow structure 44b at the time of leak inspection. Therefore, the rate of increase in the humidity of the hollow structure 44b at the time of leak inspection is further increased, and the time required for the leak inspection can be further shortened. It should be noted that the outer wall 20 may be structured such that a part thereof, instead of the entirety in contact with the 44b of the hollow structure, is thinned.

Figure 5:
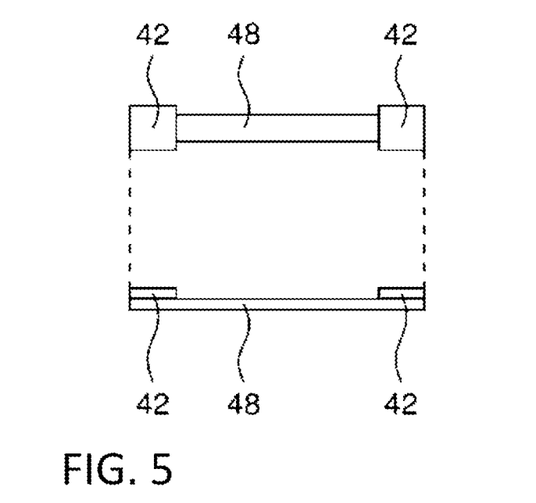
FIG. 5 is a top view and a cross sectional view showing a variation of the leak detection element according to Embodiment 1.

Further, as shown in FIG. 5, the metal layer 46 may be removed from the leak detection element 40. Since Mo, a component of the corrodible metal layer 48, is a corrodible metal, the electrical resistance thereof becomes higher due to the electrochemical reaction even with Mo alone under the high humidity environment.

The corrodible metal layer 48 may be replaced with a corrodible metal other than Mo or an alloy containing a corrodible metal. Specifically, it may be replaced with any one of W, Mg, WSi (alloy of W and Si).

Figure 6:
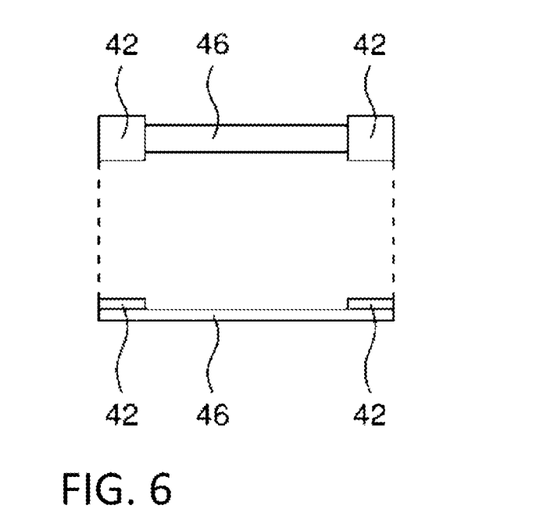
FIG. 6 is a top view and a cross sectional view showing another variation of the leak detection element according to Embodiment 1.

Further, as shown in FIG. 6, the leak detection element 40 may be constituted by the metal layer 46 and the leak detection element electrodes 42 made of Mo. In the leak detection element 40 structured in the way described above, the leak detection element electrodes 42 made of Mo are in contact with the metal layer 46 made of Au, and the side surface and a part of the surface of the leak detection element electrodes 42 are in contact with the hollow structure 44b, so that the electrical resistance becomes high under the high humidity environment. Thus, an advantageous effect can be obtained such that the time required for the leak inspection can be shortened. Note that the leak detection element electrode 42 may be replaced with a corrodible metal other than Mo or an alloy containing a corrodible metal. Specifically, it may be replaced with any one of W, Mg, WSi.

Further, the metal layer 46 may be replaced with a metal, other than Au, having a lower ionization tendency than any one of Mo, W, Mg, and WSi. Specifically, it may be replaced with any one of Pt, Cu, Pd, and Ag.

Furthermore, in the leak inspection, as the water vapor partial pressure (obtained by dividing the product of saturated water vapor pressure and relative humidity (percent) by 100) in the high humidity environment in which the semiconductor apparatus 10 is placed increases, the rate of increase in the electrical resistance of the leak detection element 40 increases. This water vapor partial pressure is preferably equal to or more than 492 hPa that is the water vapor partial pressure at 85% RH and the temperature of 85 degrees C.

Further, in the leak inspection, the semiconductor apparatus 10 may not be placed in the high humidity environment but may be placed in an alkaline gas, such as a gas atmosphere containing ammonia. Even in the alkaline gas atmosphere, an electrochemical reaction occurs in the leak detection element 40, and the electrical resistance increases, so that the same effect can be obtained. When the alkaline gas is a gas containing ammonia, the preferable conditions are such that the mole fraction of ammonia in the gas is equal to or higher than 0.1% and the water vapor partial pressure of the gas is equal to or higher than 9.51 hPa (water vapor partial pressure at 30% RH and temperature of 25 degrees C.).

Embodiment 2

Figure 7A:
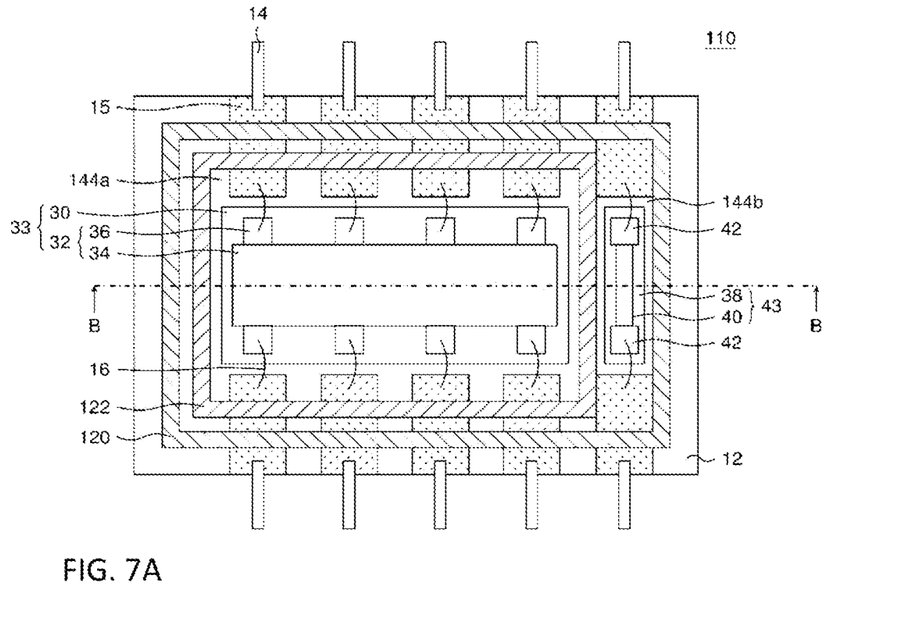
FIG. 7A and FIG. 7B are a top view and a cross sectional view showing a semiconductor apparatus according to Embodiment 2 respectively.
Figure 7B:
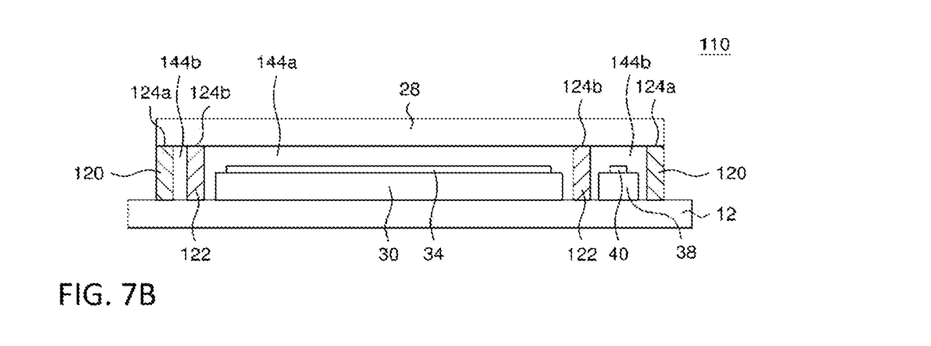

A semiconductor apparatus according to Embodiment 2 of the present invention will be described. Since the semiconductor apparatus according to Embodiment 2 has a structure similar to that of the semiconductor apparatus according to Embodiment 1, differences from Embodiment 1 will be mainly described here. FIG. 7A and FIG. 7B are diagrams illustrating a semiconductor apparatus 110 according to Embodiment 2. FIG. 7A is a top view of the semiconductor apparatus 110. Note that the lid 28 is shown transparently. FIG. 7B is a cross sectional view taken along the line B-B of FIG. 7A.

In the semiconductor apparatus 110 according to Embodiment 2, as shown in FIG. 7A, a separation wall 122 is formed so as to go around to separate a hollow structure 144a and a hollow structure 144b from each other. The hollow structure 144a is formed to be in contact with the semiconductor device 33. The hollow structure 144b is located on the outside of the hollow structure 144a and is formed to be in contact with the leak detection device 43. Thus, the semiconductor apparatus 110 is structured such that an outer wall 120 is entirely in contact with the hollow structure 144b.

In the semiconductor apparatus 110 structured as described above, since the outer wall 120 is entirely in contact with the hollow structure 144b, when a joint portion 124a or the outer wall 120 has a problem, a high humidity gas easily enters the hollow structure 144b. Therefore, when the leak inspection similar to that of Embodiment 1 is performed for the semiconductor apparatus 110 having poor hermeticity, the humidity increase of the hollow structure 144b can be further accelerated, and the time for the leak inspection can be further shortened.

Further, since the outer wall 120 surrounds the hollow structure 144b so as to go around, even if only a part of the joint portion 124a or only a part of the outer wall 120 has a problem, a determination of the hermeticity can be reliably performed.

Note that, as shown in FIG. 5, the metal layer 46 may be removed from the leak detection element 40. Since Mo, a component of the corrodible metal layer 48, is a corrodible metal, the electrical resistance thereof becomes higher due to the electrochemical reaction even with Mo alone under the high humidity environment.

In addition, the corrodible metal layer 48 may be replaced with a corrodible metal other than Mo or an alloy containing a corrodible metal. Specifically, it may be replaced with any one of W, Mg, WSi Further, as shown in FIG. 6, the leak detection element 40 may be constituted by the metal layer 46 and the leak detection element electrodes 42 made of Mo. In the leak detection element 40 structured in the way described above, the leak detection element electrodes 42 made of Mo are in contact with the metal layer 46 made of Au, and the side surface and a part of the surface of the leak detection element electrodes 42 are in contact with the hollow structure 44b, so that the electrical resistance becomes high under the high humidity environment. Thus, an advantageous effect can be obtained such that the time required for the leak inspection can be shortened. Note that the leak detection element electrode 42 may be replaced with a corrodible metal other than Mo or an alloy containing a corrodible metal. Specifically, it may be replaced with any one of W, Mg, WSi.

Further, the metal layer 46 may be replaced with a metal, other than Au, having a lower ionization tendency than any one of Mo, W, Mg, and WSi. Specifically, it may be replaced with any one of Pt, Cu, Pd, and Ag.

Furthermore, in the leak inspection, as the water vapor partial pressure in the high humidity environment in which the semiconductor apparatus 110 is placed increases, the rate of increase in the electrical resistance of the leak detection element 40 increases. This water vapor partial pressure is preferably equal to or more than 492 hPa.

Further, in the leak inspection, the semiconductor apparatus 110 may not be placed in the high humidity environment but may be placed in an alkaline gas, such as a gas atmosphere containing ammonia. When the alkaline gas is a gas containing ammonia, the preferable conditions are such that the mole fraction of ammonia in the gas is equal to or higher than 0.1% and the water vapor partial pressure of the gas is equal to or higher than 9.51 hPa (water vapor partial pressure at 30% RH and temperature of 25 degrees C.).

Embodiment 3

Figure 8A:
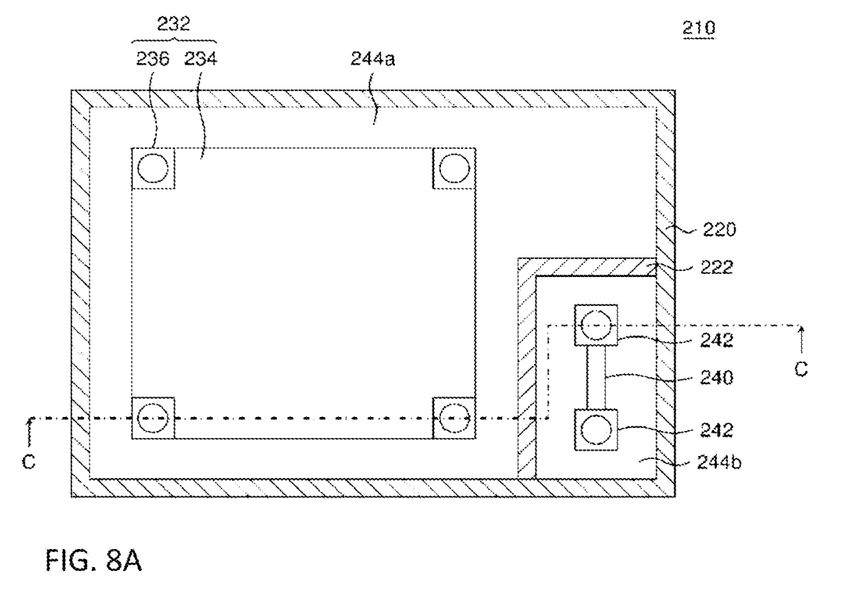
FIG. 8A and FIG. 8B are a top view and a cross sectional view showing a semiconductor apparatus according to Embodiment 3 respectively.
Figure 8B:
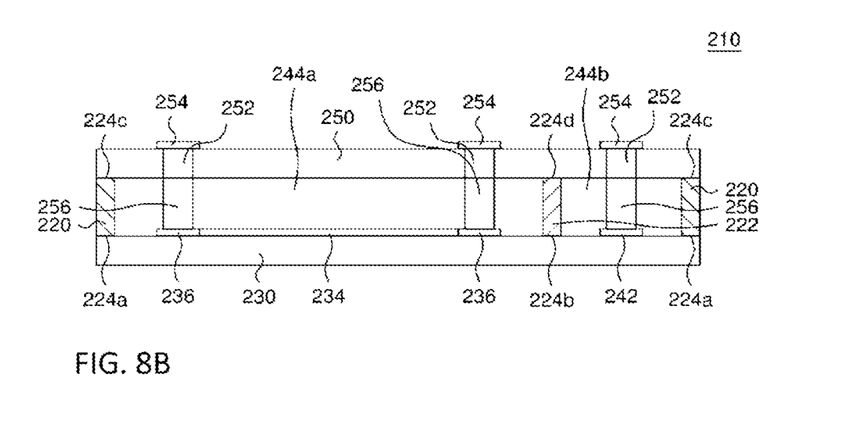

A semiconductor apparatus according to Embodiment 3 of the present invention will be described. FIG. 8A and FIG. 8B are diagrams showing a semiconductor apparatus 210 according to Embodiment 3. FIG. 8A is a top view of the semiconductor apparatus 210. Note that a lid substrate 250 is shown transparently. FIG. 8B is a cross sectional view taken along the line C-C of FIG. 8A. The semiconductor apparatus 210 has a Wafer Level Chip Scale Package (WLCSP) structure.

A semiconductor element 232 and a leak detection element 240 are provided on a semiconductor substrate 230. The semiconductor substrate 230 is made of a semiconductor such as Si, GaAs, or SiC.

The semiconductor element 232 includes a circuit element 234 and semiconductor element electrodes 236. The circuit element 234 includes, for example, a power amplifier circuit. The semiconductor element electrodes 236 are electrodes for supplying power to the circuit element 234 or for the signal input/output.

Figure 9:
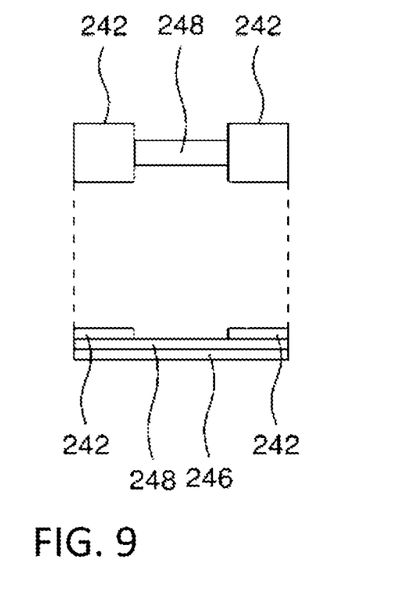
FIG. 9 is a top view and a cross sectional view showing a leak detection element according to Embodiment 3.

FIG. 9 is a top view and a cross sectional view of the leak detection element 240. The leak detection element 240 is formed such that a corrodible metal layer 248 is laminated on a metal layer 246, and leak detection element electrodes 242 are formed on both ends of the corrodible metal layer 248. The metal layer 246 is made of Au. The corrodible metal layer 248 is made of Mo which is a corrodible metal. The leak detection element electrodes 242 are made of Au. The upper surface of the corrodible metal layer 248 is exposed except for portions covered with the leak detection element electrodes 242. Note that the leak detection element electrodes 242 may be extended out from the corrodible metal layer 248 and formed on the semiconductor substrate 230 or another structure. In addition, in FIG. 8 B, the corrodible metal layer 248 and the metal layer 246 under the leak detection element electrodes 242 are not shown.

In this embodiment, the semiconductor element 232 is a semiconductor device, and the leak detection element 240 is a leak detection device. Then, the semiconductor device and the leak detection device are provided on the semiconductor substrate 230.

An outer wall 220, a separation wall 222, and bumps 256 are bonded on the semiconductor substrate 230. As shown in FIG. 8A, the outer wall 220 is made of a metal or a resin and bonded at a joint portion 224a to surround the semiconductor element 232 and the leak detection element 240 so as to go around. The separation wall 222 is made of a metal or a resin, and bonded at a joint portion 224b such that the region surrounded by the outer wall 220 is separated into a region including the semiconductor element 232 and a region including the leak detection element 240 as shown in FIG. 8A. The bumps 256 are made of a conductive material such as a metal, and are bonded onto the semiconductor element electrodes 236 and the leak detection element electrodes 242.

The lid substrate 250 is bonded to the outer wall 220, the separation wall 222, and the bumps 256 so as to face the semiconductor substrate 230. The lid substrate 250 is made of a semiconductor such as Si, GaAs, or SiC. The lid substrate 250 is bonded to the outer wall 220 at a join portion 224c and is bonded to the separation wall 222 at a joint portion 224d.

The semiconductor substrate 230, the outer wall 220, the separation wall 222, and the lid substrate 250 form a hollow structure 244a in contact with the semiconductor element 232 and a hollow structure 244b in contact with the leak detection element 240. The hollow structure 244a and the hollow structure 244b are in a hermetically sealed state independent of each other, and each is filled with dry nitrogen. The outer wall 220 has a portion in contact with and a portion not in contact with the hollow structure 244b. The hollow structure 244a and the hollow structure 244b may be in a vacuum.

Vias 252 go through the lid substrate 250, and lid electrodes 254 are formed on the vias 252. The lid electrodes 254 are made of Au and are electrically connected to the semiconductor element electrodes 236 or the leak detection element electrodes 242, through the vias 252 and the bumps 256. Note that the lid electrodes 254 do not need to be directly on the vias 252, and wires may be extended out from the vias 252 to form the lid electrodes on the lid substrate 250.

A method of manufacturing the semiconductor apparatus according to Embodiment 3 will be described. First, the semiconductor element 232 and the leak detection element 240 are formed on the semiconductor substrate 230 at the wafer level. A well-known semiconductor process may be used to form these.

Next, the outer wall 220, the separation wall 222, and the bumps 256 are formed on the semiconductor substrate 230. A method of forming these members made of metal will be described below. These members are formed by patterning a resist to form an opening on the semiconductor substrate 230 and by plating a metal in the opening. The outer wall 220, the separation wall 222, and the bumps 256 may be formed at the same time, only two of them may be formed at the same time, or they may be formed in different steps.

Next, the lid substrate 250 in which the vias 252 and the lid electrodes 254 are formed is bonded to the outer wall 220, the separation wall 222, and the bumps 256. Solder, a conductive adhesive or a metal paste may be used for the bonding. The bonding is performed in a dry nitrogen atmosphere. As a result, the hollow structure 244a and the hollow structure 244b are filled with dry nitrogen.

Next, the semiconductor apparatus at the wafer level is separated in a chip size by dicing. Thus, the formation of the semiconductor apparatus 210 is completed.

A leak inspection similar to that of Embodiment 1 is performed on the semiconductor apparatus 210 structured as described above. In the semiconductor apparatus according to Embodiment 3, since the hollow structure 244a and the hollow structure 244b are separated from each other by the separation wall 222, the time required for the leak inspection can be shortened for the same reason as described in Embodiment 1.

Figure 10A:
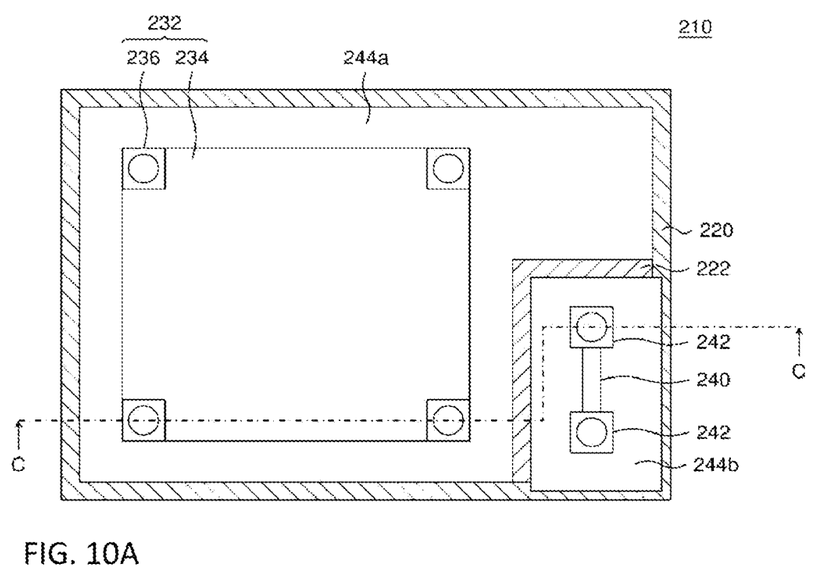
FIG. 10A and FIG. 10B are a top view and a cross sectional view showing a variation of the semiconductor apparatus according to Embodiment 3 respectively.
Figure 10B:
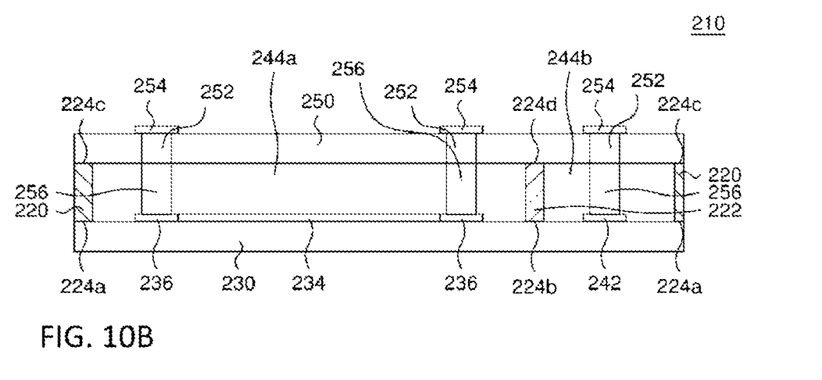

As shown in FIG. 10A and FIG. 10B, the thickness of a part of the outer wall 220 that is in contact with the hollow structure 244b may be reduced. In this case, if the joint portions 224a, 224c or the part of the outer wall 220 that is in contact with the hollow structure 244b have a problem, the high humidity gas easily enters the hollow structure 244b at the time of leak inspection. Thus, the humidity increase of the hollow structure 244b can be further accelerated, and the time required for the leak inspection can be further shortened. It should be noted that the outer wall 220 may be structured such that a part thereof, instead of the entirety in contact with the hollow structure 244b, is thinned.

Figure 11:
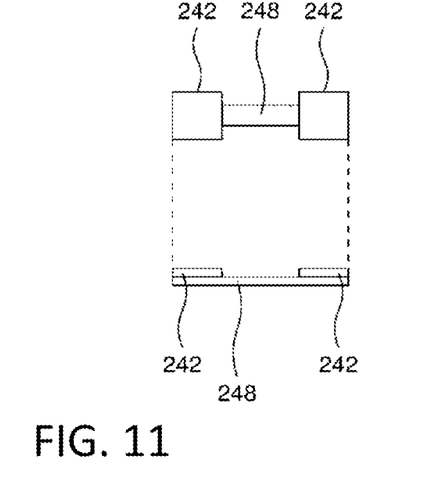
FIG. 11 is a top view and a cross sectional view showing a variation of the leak detection element according to Embodiment 3.

Further, as shown in FIG. 11, the metal layer 246 may be removed from the leak detection element 240. Since Mo, a component of the corrodible metal layer 248, is a corrodible metal, the electrical resistance thereof becomes higher due to an electrochemical reaction even with Mo alone under the high humidity environment.

In addition, the corrodible metal layer 248 may be replaced with a corrodible metal other than Mo or an alloy containing a corrodible metal. Specifically, it may be replaced with any one of W, Mg, WSi.

Figure 12:
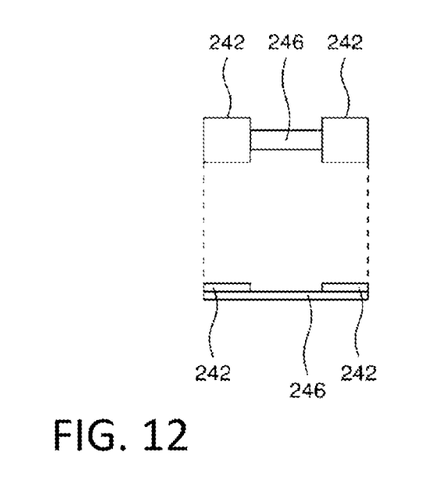
FIG. 12 is a top view and a cross sectional view showing another variation of the leak detection element according to Embodiment 3.

Further, as shown in FIG. 12, the leak detection element 240 may be constituted by the metal layer 246 and the leak detection element electrodes 242 made of Mo. In the leak detection element 240 structured in the way described above, the leak detection element electrodes 242 made of Mo are in contact with the metal layer 246 made of Au, and the side surface and a part of the surface of the leak detection element electrodes 242 are in contact with the hollow structure 244b, so that the electrical resistance becomes high under the high humidity environment. Thus, an advantageous effect can be obtained such that the time required for the leak inspection can be shortened. Note that the leak detection element electrode 242 may be replaced with a corrodible metal other than Mo or an alloy containing a corrodible metal. Specifically, it may be replaced with any one of W, Mg, WSi.

Further, the metal layer 246 may be replaced with a metal, other than Au, having a lower ionization tendency than any one of Mo, W, Mg, and WSi. Specifically, it may be replaced with any one of Pt, Cu, Pd, and Ag.

Furthermore, in the leak inspection, as the water vapor partial pressure in the high humidity environment in which the semiconductor apparatus 210 is placed increases, the rate of increase in the electrical resistance of the leak detection element 240 increases. This water vapor partial pressure is preferably equal to or more than 492 hPa.

Further, in the leak inspection, the semiconductor apparatus 210 may not be placed in the high humidity environment but may be placed in an alkaline gas, such as a gas atmosphere containing ammonia. When the alkaline gas is a gas containing ammonia, the preferable conditions are such that the mole fraction of ammonia in the gas is equal to or higher than 0.1% and the water vapor partial pressure of the gas is equal to or higher than 9.51 hPa (water vapor partial pressure at 30% RH and temperature of 25 degrees C.).

Further, in Embodiment 3, the lid substrate 250 is a substrate made of a semiconductor, but a sheet film made of an insulating resin may be bonded by a lamination method or a method of a Spin-coating film Transfer and hot Pressing (STP) technology. Or, except for the above, a member or a method for maintaining the hermeticity of the hollow structure 244a and the hollow structure 244b may be used.

In Embodiment 3, the leak inspection is performed after the semiconductor apparatus 210 is separated in a chip size, but the leak inspection may be performed on the semiconductor apparatus at the wafer level before the separation into chips. In this case, the lid substrate 250 is separated in a chip size by dicing. In the case where the outer wall 220 is on the dicing line, it is also separated by dicing. Note that the semiconductor substrate 230 is not diced and is kept at the wafer level. In this case, when the semiconductor apparatus 210 is moved to an inspection device before the leak inspection, it is not necessary to handle a plurality of semiconductor apparatuses in a separated chip state, and the semiconductor substrate can be handled at the wafer level. This facilitates handling of the semiconductor apparatus. Furthermore, since a wafer prober can be used to measure the electrical resistance of the leak detection element 240, the time required to measure the electrical resistance can be shortened.

Embodiment 4

Figure 13A:
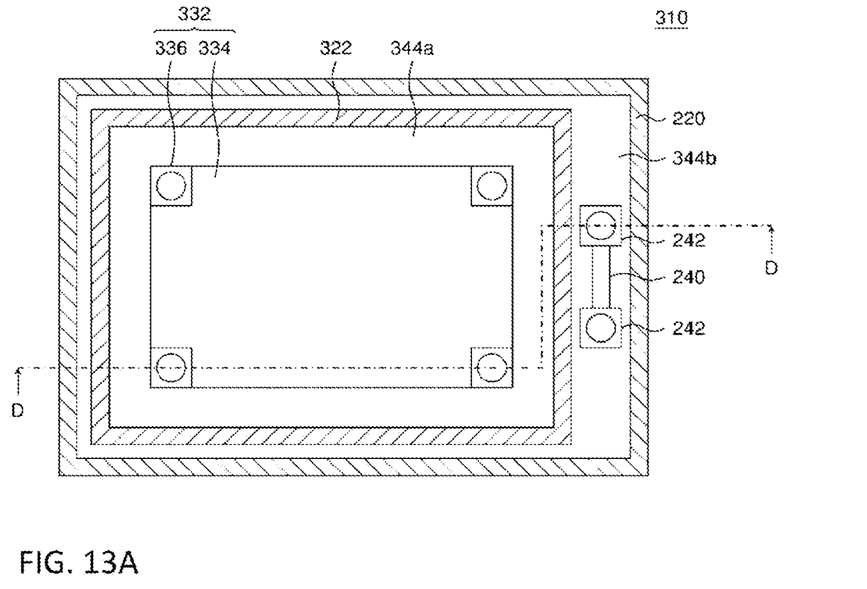
FIG. 13A and FIG. 13B are a top view and a cross sectional view showing a semiconductor apparatus according to Embodiment 4 respectively.
Figure 13B:
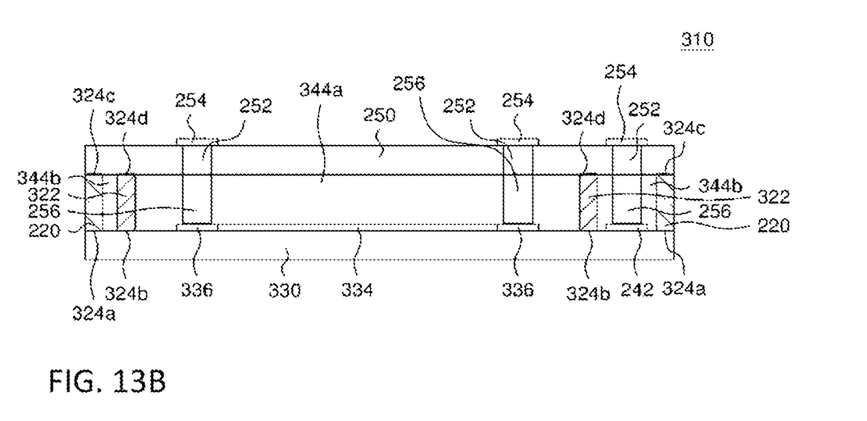

A semiconductor apparatus according to Embodiment 4 of the present invention will be described. Since the semiconductor apparatus according to Embodiment 4 has a structure similar to that of the semiconductor apparatus according to Embodiment 3, differences from Embodiment 3 will be mainly described here. FIG. 13A and FIG. 13B are diagrams illustrating a semiconductor apparatus 310 according to Embodiment 4. FIG. 13A is a top view of the semiconductor apparatus 310. Note that the lid substrate 250 is shown transparently. FIG. 13B is a cross-sectional view taken along the line D-D of FIG. 13A.

In the semiconductor apparatus 310 according to Embodiment 4, as shown in FIG. 13A, a separation wall 322 is formed so as to go around, and separates a hollow structure 344a and a hollow structure 344b from each other. The hollow structure 344a is formed to be in contact with a semiconductor element 332. The hollow structure 344b is outside the hollow structure 344a and formed to be in contact with the leak detection element 240. Thus, the semiconductor apparatus 310 is structured such that the outer wall 220 is entirely in contact with the hollow structure 344b.

In the semiconductor apparatus 310 structured as described above, since the outer wall 220 is entirely in contact with the hollow structure 344b, when joint portions 324a and 324c or the outer wall 220 have a problem, a high humidity gas easily enters the hollow structure 344b. Therefore, when the leak inspection similar to that of Embodiment 3 is performed for the semiconductor apparatus 310 having poor hermeticity, the humidity increase in the hollow structure 344b can be further accelerated, and the time required for the leak inspection can be further shortened.

In addition, since the outer wall 220 surrounds the hollow structure 344b so as to go around, even if only a part of the joint portions 324a, 324c, or only a part of the outer wall 220 has a problem, a determination of the hermeticity can be reliably performed.

Note that, as shown in FIG. 11, the metal layer 246 may be removed from the leak detection element 240. Since Mo, a component of the corrodible metal layer 248, is a corrodible metal, the electrical resistance thereof becomes higher due to an electrochemical reaction even with Mo alone under the high humidity environment.

Further, the corrodible metal layer 248 may be replaced with a corrodible metal other than Mo or an alloy containing a corrodible metal. Specifically, it may be replaced with any one of W, Mg, WSi.

Further, as shown in FIG. 12, the leak detection element 240 may be constituted by the metal layer 246 and the leak detection element electrodes 242 made of Mo. In the leak detection element 240 structured in the way described above, the leak detection element electrodes 242 made of Mo are in contact with the metal layer 246 made of Au, and the side surface and a part of the surface of the leak detection element electrodes 242 are in contact with the hollow structure 344b, so that the electrical resistance becomes high under the high humidity environment. Thus, an advantageous effect can be obtained such that the time required for the leak inspection can be shortened. Note that the leak detection element electrode 242 may be replaced with a corrodible metal other than Mo or an alloy containing a corrodible metal. Specifically, it may be replaced with any one of W, Mg, WSi.

Further, the metal layer 246 may be replaced with a metal, other than Au, having a lower ionization tendency than any one of Mo, W, Mg, and WSi. Specifically, it may be replaced with any one of Pt, Cu, Pd, and Ag.

Furthermore, in the leak inspection, as the water vapor partial pressure in the high humidity environment in which the semiconductor apparatus 310 is placed increases, the rate of increase in the electrical resistance of the leak detection element 240 increases. This water vapor partial pressure is preferably equal to or more than 492 hPa.

Further, in the leak inspection, the semiconductor apparatus 310 may not be placed in the high humidity environment but may be placed in an alkaline gas, such as a gas atmosphere containing ammonia. When the alkaline gas is a gas containing ammonia, the preferable conditions are such that the mole fraction of ammonia in the gas is equal to or higher than 0.1% and the water vapor partial pressure of the gas is equal to or higher than 9.51 hPa (water vapor partial pressure at 30% RH and temperature of 25 degrees C.).

Further, in this Embodiment, the lid substrate 250 is a substrate made of a semiconductor, but a sheet film made of an insulating resin may be bonded by a lamination method or a method of a Spin-coating film Transfer and hot Pressing (STP) technology. Or, except for the above, a member or a method for maintaining the hermeticity of the hollow structure 344*a* and the hollow structure 344*b* may be used.

Further, the leak inspection may be performed on the semiconductor apparatus at the wafer level before the separation into chips. In this case, the lid substrate 250 is separated in a chip size by dicing. In the case where the outer wall 220 is on the dicing line, it is also separated by dicing. Note that the semiconductor substrate 330 is not diced and is kept at the wafer level. In this case, when the semiconductor apparatus 310 is moved to an inspection device before the leak inspection, it is not necessary to handle a plurality of semiconductor apparatuses in a separated chip state, and the semiconductor substrate can be handled in the wafer state. This facilitates handling of the semiconductor apparatus. Furthermore, since a wafer prober can be used to measure the electrical resistance of the leak detection element 240, the time required to measure the electrical resistance can be shortened.

DESCRIPTION OF REFERENCE NUMERALS AND SIGNS

10, 110, 210, 310 semiconductor apparatus, 12 package substrate, 14 lead, 15 lead electrode, 16 bonding wire, 20, 120, 220 outer wall, 22, 122, 222, 322 separation wall, 28 lid, 30, 230, 330 semiconductor substrate, 32, 232, 332 semiconductor element, 33 semiconductor device, 36, 236, 336 semiconductor element electrode, 40, 240 leak detection element, 42, 242 leak detection element electrode, 43 leak detection device, 44*a*, 144*a*, 244*a*, 344*a* hollow structure, 44*b*, 144*b*, 244*b*, 344*b* hollow structure, 46, 246 metal layer, 48, 248 corrodible metal layer, 250 lid substrate, 252 via, 254 lid electrode, 256 bump

The invention claimed is:

1. A semiconductor apparatus comprising:
    a substrate;
    a semiconductor device provided on the substrate;
    a leak detection device provided on the substrate;
    an outer wall that is provided on the substrate and surrounds the semiconductor device and the leak detection device so as to go around as viewed from a direction perpendicular to the substrate;
    a separation wall that is provided on the substrate, the separation wall separating a region surrounded by the outer wall into a region including the semiconductor device and a region including the leak detection device as viewed from the direction perpendicular to the substrate;
    a lid that is provided on the outer wall and the separation wall so as to face the substrate, the lid forming, with the substrate, the outer wall, and the separation wall, a first hollow structure of a hermetically sealed state in contact with the semiconductor device and a second hollow structure of a hermetically sealed state in contact with the leak detection device; and
    a terminal that is electrically connected to the leak detection device and at least a part of which is exposed to an outside, wherein
    at least a part of a portion of the leak detection device that is in contact with the second hollow structure is a leak detection member made of a corrodible metal or an alloy containing a corrodible metal, and the outer wall includes a first outer wall portion that is in contact with the second hollow structure, and a second outer wall portion that is not in contact with the second hollow structure and contacts the first hollow structure.

2. The semiconductor apparatus according to claim 1, wherein at least a part of the first outer wall portion has a thickness thinner than that of the second outer wall portion.

3. The semiconductor apparatus according to claim 2, further comprising:
    a lead that is bonded to the substrate and electrically connected to a leak detection device electrode via a bonding wire and a lead electrode, wherein
    the leak detection device includes the leak detection device electrode, and the terminal is the lead.

4. The semiconductor apparatus according to claim 2, further comprising:
    a bump that is formed from a leak detection device electrode to the lid and electrically connected to the leak detection device electrode; and
    a lid electrode that is provided on the lid and electrically connected to a via, wherein
    the leak detection device includes the leak detection device electrode;
    the lid is provided with the via that is electrically connected to the bump; and
    the terminal is the lid electrode.

5. The semiconductor apparatus according to claim 2, wherein the leak detection member is made of any one of Mo, W, Mg, and WSi.

6. The semiconductor apparatus according to claim 2, wherein the leak detection device is provided, under the leak detection member, with a metallic layer formed of a metal having a lower ionization tendency than that of the leak detection member.

7. The semiconductor apparatus according to claim 1, further comprising:
    a lead that is bonded to the substrate and electrically connected to a leak detection device electrode via a bonding wire and a lead electrode, wherein
    the leak detection device includes the leak detection device electrode, and the terminal is the lead.

8. The semiconductor apparatus according to claim 7, wherein the leak detection member is made of any one of Mo, W, Mg, and WSi.

9. The semiconductor apparatus according to claim 7, wherein the leak detection device is provided, under the leak detection member, with a metallic layer formed of a metal having a lower ionization tendency than that of the leak detection member.

10. The semiconductor apparatus according to claim 1, further comprising:
    a bump that is formed from a leak detection device electrode to the lid and electrically connected to the leak detection device electrode; and
    a lid electrode that is provided on the lid and electrically connected to a via, wherein
    the leak detection device includes the leak detection device electrode;
    the lid is provided with the via that is electrically connected to the bump; and
    the terminal is the lid electrode.

11. The semiconductor apparatus according to claim 10, wherein the leak detection member is made of any one of Mo, W, Mg, and WSi.

12. The semiconductor apparatus according to claim 10, wherein the leak detection device is provided, under the leak detection member, with a metallic layer formed of a metal having a lower ionization tendency than that of the leak detection member.

13. The semiconductor apparatus according to claim 1, wherein the leak detection member is made of any one of Mo, W, Mg, and WSi.

14. The semiconductor apparatus according to claim 13, wherein the leak detection device is provided, under the leak detection member, with a metallic layer formed of a metal having a lower ionization tendency than that of the leak detection member.

15. The semiconductor apparatus according to claim 1, wherein the leak detection device is provided, under the leak detection member, with a metallic layer formed of a metal having a lower ionization tendency than that of the leak detection member.

16. The semiconductor apparatus according to claim 15, wherein the metallic layer is made of any one of Au, Pt, Cu, Pd, and Ag.

* * * * *